United States Patent [19]
Kim

[11] Patent Number: 5,874,128
[45] Date of Patent: Feb. 23, 1999

[54] METHOD AND APPARATUS FOR UNIFORMLY SPIN-COATING A PHOTORESIST MATERIAL

[75] Inventor: Choung-hyep Kim, Seoul, Rep. of Korea

[73] Assignee: Samsung Electronics Co., Ltd., Suwon, Rep. of Korea

[21] Appl. No.: 885,793

[22] Filed: Jun. 30, 1997

[30] Foreign Application Priority Data

Jan. 22, 1997 [KR] Rep. of Korea ................... 1997 1708

[51] Int. Cl.⁶ ................... B05D 3/12; B05C 11/02
[52] U.S. Cl. ................... 427/240; 427/385.5; 437/231; 118/52
[58] Field of Search ................... 427/240, 385.5; 437/231; 118/52, 53

[56] References Cited

U.S. PATENT DOCUMENTS 5,264,246  11/1993  Ikeno ................... 427/240

FOREIGN PATENT DOCUMENTS 93-8859   9/1993   Rep. of Korea .
97-10497  10/1994  Rep. of Korea .

*Primary Examiner*—Janyce Bell
*Attorney, Agent, or Firm*—Jones & Volentine, L.L.P.

[57] ABSTRACT

A method and apparatus for uniformly spin-coating photoresist material on wafers before the wafers are subjected to a photoetching process. The spin-coating apparatus comprises a first rotating device for rotating a rotating connector about a first axis and a second rotating device located on the outer portion of the rotating connector. The second rotating device rotates a wafer about a second axis while the rotating connector rotates around the first axis. The first and second axes are parallel to each other but are spaced apart by a designated distance. The designated distance can be adjusted and a plurality of second rotating devices may be connected to outer portions of the rotating connector.

20 Claims, 4 Drawing Sheets

METHOD AND APPARATUS FOR UNIFORMLY SPIN-COATING A PHOTORESIST MATERIAL

BACKGROUND OF THE INVENTION

1. Field of the Invention

The present invention relates to a method and apparatus for applying photoresist material on a semiconductor wafer. More specifically, the present invention relates to a method and apparatus for obtaining a uniform photoresist layer on a wafer in preparation for a subsequent photoetching process.

2. Description of the Related Art

Semiconductor devices are manufactured through a series of processes. One such process is the deposition of a photoresist material on the surface of a semiconductor wafer in preparation for a subsequent etching process. Many methods are available for applying photoresist material to wafers but they all have certain drawbacks.

Available methods include an immersing method, a spraying method, and a rolling method, which are usually adapted for use with liquid photoresist materials. Because the back sides of the wafers may be coated with the photoresist material during the immersion and spraying methods, these two methods are inappropriate for semiconductor devices. The rolling method is generally used for printed circuit boards but it is inappropriate for semiconductor devices because it is difficult to control the thickness of the photoresist layer using this method. Accordingly, a spin-coating method has been introduced to overcome the deficiencies of the above methods.

The spin-coating method is one of the better methods for precisely controlling the thickness of a photoresist layer. For example, if the thickness of the photoresist layer is 0.5 μm, the thickness variation would be less than about 10% using the spin-coating method. A rotating device, also known as a spinner, is usually used in such a spin-coating method. A conventional spin-coating apparatus is shown in FIG. 1.

Referring to FIG. 1, wafers 10 are fixed on vacuum chucks 7 by a vacuum suction force and are rotated by a spinner 5. A bowl 8 is installed above the vacuum chucks 7 to protect photoresist dispensed to the wafers 10 from scattering when the wafers 10 are rotated. An exhaust port 9 is formed at a predetermined position on the side of the bowl 8. A catch cup 11 is installed at the bottom of the apparatus, where the photoresist material dropping from the bowl 8 is collected.

The operation of the spin-coating apparatus is as follows. First, an elevator 12 is operated to elevate a cassette 2 loaded with wafers 10 to the level of the vacuum chucks 7. The wafers 10 in the cassette 2 are then successively transferred to the vacuum chucks 7. Filtered nitrogen 6 is supplied to the surface of the wafers 10 via a conduit to blow away the particles on the wafers 10.

Next, a primer 3 is applied to the wafers 10 via conduit to enhance the adhesion of the photoresist 4 to the wafers 10. The primer 3 may be applied to the wafers 10 by spinning or evaporating. An evaporation priming process or a vacuum baking evaporation priming process may also be used.

When the priming process is completed, the photoresist 4 is dispensed on the wafers 10 via a conduit. Two pumping systems may be used for the dispensing process. In the first pumping system, the photoresist contained in a vessel is pushed out of the vessel through a tip at the end of the conduit by using dry nitrogen gas to increase the pressure inside the vessel. The other pumping system is a diaphragm system in which a bellows is used to compress and push out photoresist through the tip of the conduit. The particular thickness of the photoresist layer coated on the wafers 10 does not have much of an influence on the process parameters. However, when an insufficient amount of photoresist is supplied, the surfaces of the wafers 10 cannot be completely coated with a photoresist layer. On the other hand, if too much photoresist is supplied, the back sides of the wafers may also be coated with the photoresist, which is undesirable because it affects wafer alignment.

The photoresist spin-coating process is carried out using a dynamic dispense cycle. In the dynamic dispense cycle, photoresist is applied to wafers 10 while the wafers 10 are rotated slowly at about 500 RPM. After applying the photoresist, the wafers 10 are rotated at a higher rate so that the photoresist can be uniformly spread out on the wafers 10.

After the deposition of the photoresist, the wafers 10 are unloaded from the vacuum chucks 7 and stored in the cassette 2 for transfer to an oven for subsequent processing, i.e., a soft baking process.

The spin-coating process using the spinner 5, however, suffers a drawback. Specifically, it is difficult to obtain a uniform thickness layer of photoresist on the wafers 10. The centrifugal force, which is generated by the rotation of the spinner 5, causes the photoresist to move away from the axis of the rotation. Because the magnitude of the centrifugal force depends on the distance from the axis of rotation, the movement of photoresist material varies with position on the wafer. This results in an uneven photoresist coating layer on the wafers 10.

Several approaches and apparatuses have been disclosed to overcome such deficiency. One such apparatus is disclosed in Korean Patent Publication Number 94-10497, and includes an inner bowl between a spinner and an outer bowl enclosing the spinner. The inner bowl is simultaneously moved up by an elevating means when the wafers stop rotating. When the inner bowl moves up and encloses the wafers, the movement of the air at the center of the wafers is the same as at the circumference of the wafers.

Korean Patent Publication Number 93-8859 discloses a spin-coating method for enhancing the uniformity of photoresist thickness on a wafer. The method includes three additional steps that are performed after dispensing photoresist on the surface of the wafers. First, the wafers are rotated at a first velocity for a designated amount of time. Then, the wafers are rotated at a second, faster velocity for another designated amount of time. During the rotation at the second velocity, the wafers are intermittently rotated for 1–2 seconds at a third velocity which is faster than the second velocity. The third rotation step is preferably repeated more than two times during the second rotation step. As a result, winding surfaces are formed on the wafers in association with the rotations at the different velocities.

However, the apparatus and methods described above fail to consider that a cause of the uneven photoresist thickness is the radially varying centrifugal force, which yields a radially varying thickness of photoresist material. In other words, the dispensed photoresist material is influenced by the varying centrifugal force as the spinner rotates and the material spreads over the whole surface of the wafer. The magnitude of the centrifugal force influencing the photoresist material is proportional to the square of the radius at which the material is located on the rotated wafer. Therefore the level of centrifugal force varies with the position on the wafer. For example, the force is almost zero at the center of the wafers and is at a maximum at the circumference of the wafers. Such differences in the centrifugal force result in differences in the thickness of the photoresist layer; inevitably the thickness of the photoresist layer at the center of the wafer will be different from that at the other areas of the wafer. Moreover, a wafer having a larger radius (e.g., 12 inch wafers which are still under development) will have a greater difference in the center-to-edge thickness of a photoresist layer than the 8 inch wafers that are currently used. The difference in thickness can be controlled to some extent by adjusting the spinning velocity of the spinner and modifying the process variables in association with the viscosity of the photoresist. However, the difference between the thicknesses at the center of the wafer where the centrifugal force is zero compared to the thickness at the other areas of the same wafer cannot be fundamentally eliminated.

SUMMARY OF THE INVENTION

The present invention provides a method and apparatus for uniformly spin-coating a photoresist layer on the whole surface area of a wafer by causing the centrifugal force at the center of the wafer to be greater than zero.

Generally, the centrifugal force is increased at the center of the wafer by an arrangement whereby the center of the wafer revolves around a different axis at the same time that the wafer rotates on its own central axis. A wafer's central axis is defined as an axis of rotation that is close to the geometric center of the wafer and is perpendicular to the plane of the wafer.

More specifically, a uniform photoresist layer on a wafer can be obtained by combining two different profiles—one profile associated with the rotation of a wafer on its central axis, and the other profile associated with the revolution of the wafer around an axis different from but parallel to the wafer's central axis.

To achieve these and other advantages, the present invention provides a spin-coating apparatus, for uniformly applying a layer of photoresist material to wafers, including a first rotating device for rotating a rotating connector about a first axis and a second rotating device, connected to an outer portion of that rotating connector, for rotating a wafer about a second axis while that rotating connector rotates about the first axis. The first and second axes are substantially parallel and are spaced apart by a designated distance.

In other aspects of this invention, the rotating devices comprise spinners and the rotating connector comprises a rotating disk, a rotating beam, a rotating ring-shaped member, or rotating crossed beams. The first and second rotating devices can rotate in the same or in opposite directions. There may also be a plurality of second rotating devices connected to the outer portions of the rotating connector.

The designated distance between the first axis and a second axis can be varied by an adjusting member, such as a screw, connected to the rotating connector and mechanically communicating with the second rotating device.

In another aspect of the present invention, there is provided a spin-coating method for uniformly applying a layer of photoresist material to a wafer. The method generally includes the steps of rotating a rotating connector about a first axis with a first rotating device at a first predetermined velocity and rotating a wafer about a second axis with a second rotating device located at an outer portion of that rotating connector. The second rotating device rotates at a second predetermined velocity while rotating with the rotating connector about the first axis.

According to the methods and apparatuses of the present invention, the rotations of the wafer about the two axes are performed simultaneously to eliminate the fundamental problems caused by positions on the wafer where the centrifugal force is near zero. Thus, the present invention provides for the formation of photoresist layers with uniform thickness on semiconductor wafers.

DETAILED DESCRIPTION OF THE PREFERRED EMBODIMENTS

Figure 1:
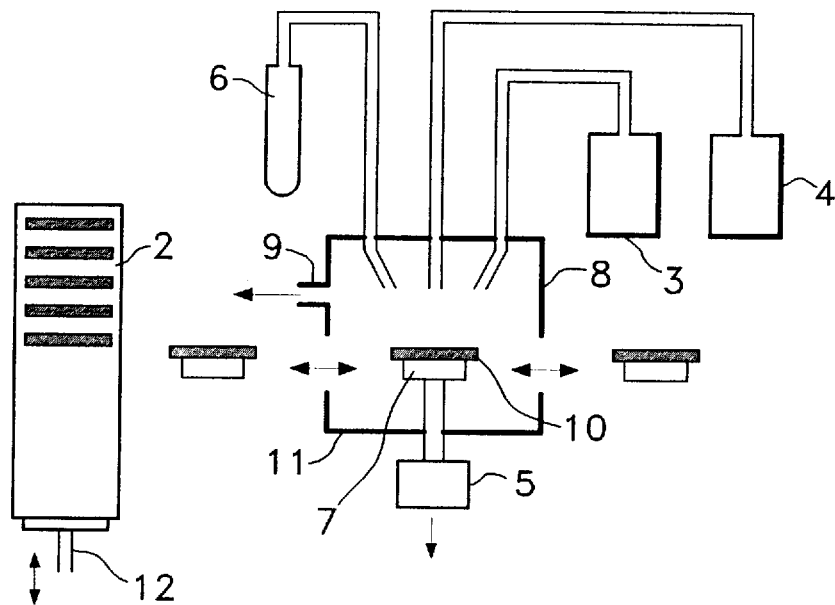
FIG. 1 is a schematic diagram of a conventional spin-coating apparatus.
Figure 2:
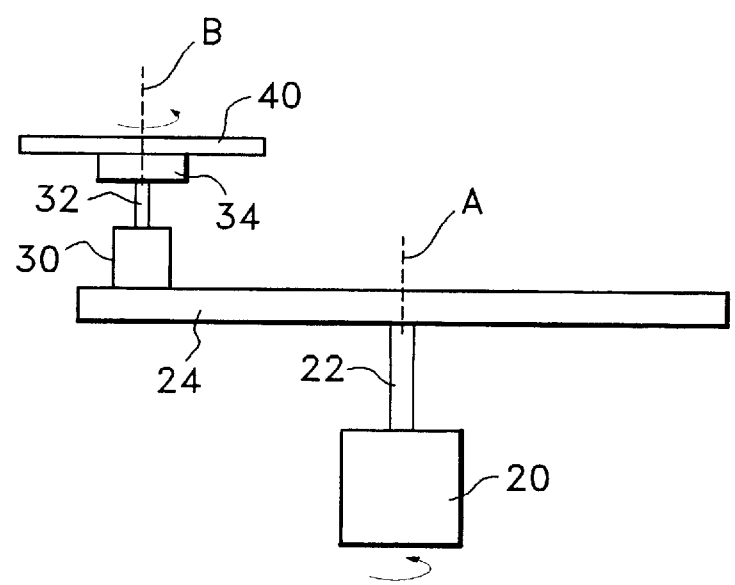
FIG. 2 is a side view of an embodiment of the spin-coating apparatus according to the present invention.
Figure 3A:
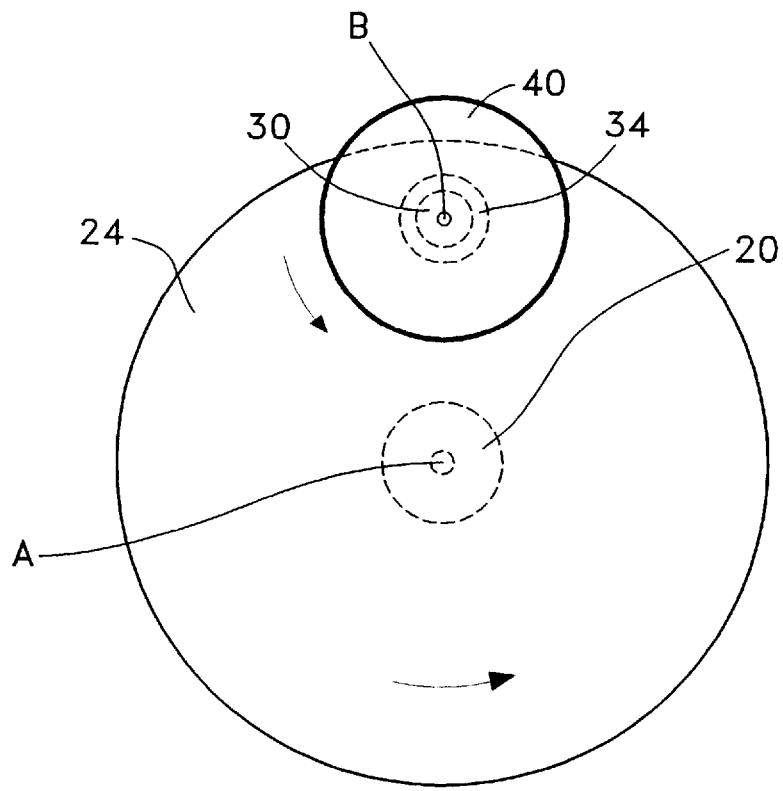
FIG. 3A and FIG. 3B are top views of modified rotating connectors according to the present invention.
Figure 3B:
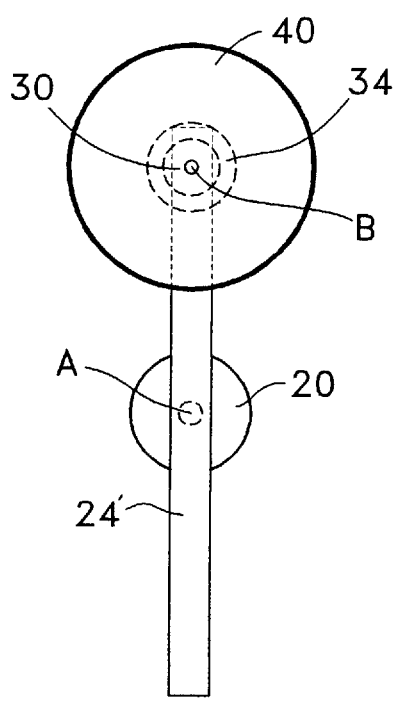

One embodiment of the spin-coating apparatus in accordance with the present invention is schematically depicted in FIG. 2. In this embodiment, a shaft 22 of a first spinner 20 is connected to the center of a rotating connector 24. On the edge of the rotating connector 24 a second spinner 30 is installed, having a shaft 32 for mounting a vacuum chuck 34. The vacuum chuck 34 holds a wafer 40 by a vacuum suction force. The rotating connector 24 transmits the rotary power of the first spinner 20 to the second spinner 30. The rotating connector may be round in shape like the disk shown in FIG. 3A. It is understood, however, that the rotating connector may be of various shapes within the scope of the present invention, such as, for example, a rotating beam 24' as illustrated in FIG. 3B, or crossed beams. The first spinner 20 and the second spinner 30 may be ordinary step motors.

The operation of the spin-coating apparatus is described with reference to FIG. 2 and FIG. 3.

As the first spinner 20 rotates about a first axis A at a predetermined velocity, the rotating connector 24, 24', on which the second spinner 30 is installed, is rotated at the same time about axis A. Thus, the rotation of the connector 24, 24' results in the revolution of the second spinner 30 about axis A. Simultaneously, the second spinner 30 rotates on its own axis B at the central axis of the wafer. Note that the axes A and B are parallel but separated by a certain distance. The spinners 20 and 30 may rotate in the same direction or in opposite directions relative to each other.

If only the rotation of the second spinner 30 is considered, the centrifugal force is near zero at axis B near the center of the wafer 40, which is held by the vacuum chuck 34. However, the rotation of the first spinner 20 makes the entire wafer 40 revolve around the axis A of the rotating connector 24, 24'. As a result, the centrifugal force at the center of the wafer 40 is greater than zero.

There was a fundamental limit to obtaining a photoresist layer having a uniform thickness using the conventional spin-coating process since the central area of the wafer experienced little or no centrifugal force as it rotated about its own central axis. The present invention provides a method for increasing the centrifugal force at the center of the wafer 40 by revolving the wafer 40 about a parallel, but displaced, axis A at the same time as rotating the wafer 40 about the wafer's own central axis B.

Figure 4A:
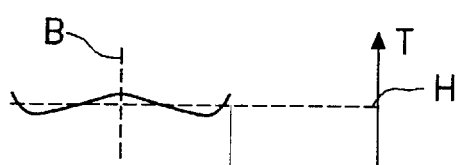
FIGS. 4A, 4B and FIG. 4C are cross-sectional profiles of photoresist layers associated with various axes of rotation in accordance with the present invention.
Figure 4B:
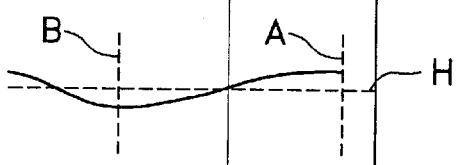
Figure 4C:
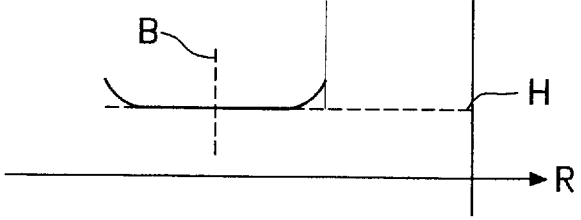

FIGS. 4A, 4B and 4C are cross-sectional profiles of photoresist layer thicknesses on a wafer. The coordinate axes T and R represent the thicknesses and the radii of the photoresist layers, respectively. For description purposes, the dimensions of the thicknesses relative to the radii are exaggerated.

First, when the second spinner 30 rotates the wafer 40 about its own central axis B (indicated by the dashed vertical line), the photoresist thickness profile in FIG. 4A can be obtained. The profile shows essentially two symmetrical parts with the axis of symmetry corresponding to the vertical dashed line, axis B, shown in the drawing. The thickness of the photoresist layer decreases as the distance from the dashed line increases, i.e., from the central axis B of the wafer 40 towards the edge area of the wafer 40. At the edge area, the thickness increases again. In the case of 8 inch wafers, the reference thickness of the photoresist layer, marked by the horizontal dashed line H, is approximately 1 $\mu$m. The variation from the reference thickness is approximately ±15Å in FIG. 4A. Specifically, the photoresist thickness at the center and the edge of the wafer 40 may be up to 15Å thicker than the reference thickness, while between the center and the edge the photoresist layer may be up to 15Å thinner than the reference thickness.

FIG. 4B shows the profile of the photoresist layer that theoretically could be obtained on the rotating connector 24, 24' if it is assumed that photoresist material is applied directly to the rotating connector 24, 24' when it is rotated by the first spinner 20 about axis A. In FIG. 4B axis A is shown as the vertical dashed line to the right of the profile. Thus the profile in FIG. 4B represents just one of the two symmetrical sides which would be formed about the axis A. The shape of the profile in FIG. 4B is similar to the shape of the left symmetrical part of the profile in FIG. 4A.

Since the edge of a wafer is not generally used, a variation in thickness at the edge area has a negligible impact on the semiconductor manufacturing process. Therefore, the invention focuses on the control of the thickness at the center area of a wafer 40 near its central axis B. According to the invention, the first spinner 20 rotates at a predetermined velocity about axis A, and at the same time, the second spinner 30 rotates about the axis B. The second spinner 30 is installed at a position near the edge area of the rotating connector 24, 24', and is rotated as well by the rotation of the first spinner 20. By simultaneous rotation of the first and the second spinners 20 and 30, the wafer 40 loaded on the second spinner 30 rotates about the shaft 32 (axis B) of the second spinner 30 and, at the same time, revolves around the shaft 22 (axis A) of the first spinner 20. Therefore, the wafer 40 is influenced by the centrifugal forces caused by the rotation about axis B as well as the revolution about axis A.

As depicted in FIG. 4C, the profile of the photoresist layer resulting from the combined centrifugal forces is the same as the combination of the profiles of FIG. 4A and FIG. 4B. Note that the photoresist layer becomes uniform over the whole surface of the wafer, except for the severely increased thickness at the edge area which is not used. Moreover, it would be apparent to those skilled in this art that the photoresist layer shown in FIG. 4C does not have a double thickness equal to the sum of the layers in FIG. 4A and FIG. 4B, even though it is described as a combination of the profiles. This is because FIG. 4B refers to a hypothetical deposition of photoresist on the rotating connector 24, 24'.

Figure 5:
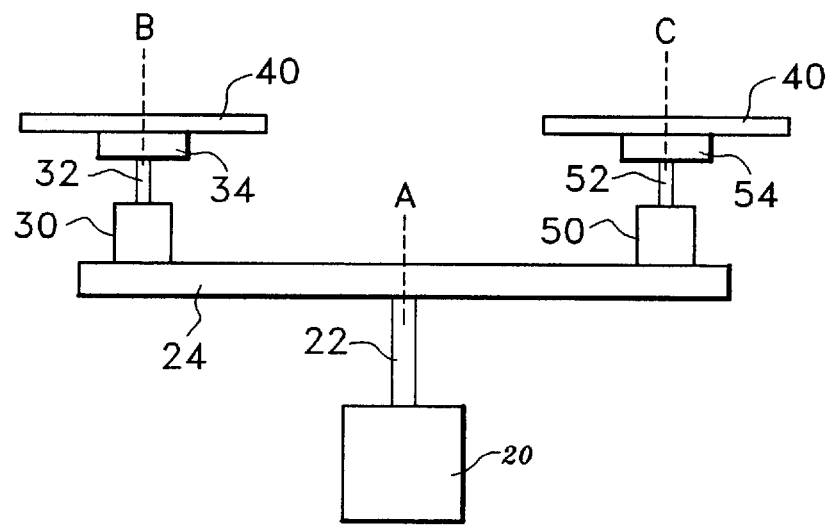
FIG. 5 is a side view of another embodiment of the spin-coating apparatus according to the present invention.

FIG. 5 illustrates another embodiment of the spin-coating apparatus, which includes a plurality of the second spinners 30 and 50 rotating about respective axes B and C, thereby allowing for coating of several wafers simultaneously.

Figure 6:
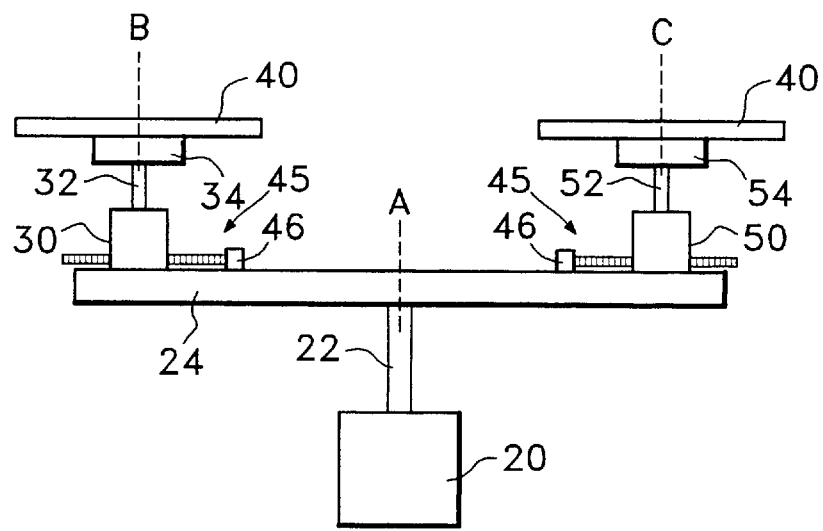
FIG. 6 is a side view of still another embodiment of the spin-coating apparatus according to the present invention.

Another embodiment of the spin-coating apparatus is depicted in FIG. 6. In this embodiment, a plurality of screw arms 45 are radially engaged with the rotating connector 24, 24' from the center towards the circumference thereof. One end of the screw arm 45 is rotatably fixed to a projection part 46 of the rotating connector 24, 24'. Accordingly, the second spinner 30 can be moved in association with the screwing movement of the screw arm 45. As a result, it is possible to adjust the distance between the axis of the rotating connector 24, 24' (axis A) and the axis of the second spinner 30 (axis B), i.e., the revolving radius of the second spinner 30, by adjusting the screw arm 45. The particular distance is determined based on the evaluation of the uniformity of layer thickness obtained by combining the thickness profiles as described with reference to FIGS. 4A, 4B, and 4C.

The present invention thus eliminates the area having essentially no centrifugal force on a wafer when photoresist material is applied thereto, by making the wafer rotate on its central axis and revolve around a different but parallel axis at the same time.

While the invention has been particularly shown and described with reference to several embodiments thereof, those skilled in the art should understand that various changes in form and details may be made without departing from the spirit and scope of the invention as defined by the appended claims and their equivalents. For example, a bowl to enclose the second spinner may be installed along the edge area of the rotating connector, such that the other wafers are protected from the scattered photoresist material. The rotating connector may be modified to form a ring shape, whereby the scattered photoresist material can be more easily discharged through the central opening area of the ring-shaped rotating connector.

What is claimed is:

1. A spin-coating apparatus for uniformly applying a layer of photoresist material to a wafer, comprising:
   a first rotating device for rotating a rotating connector about a first axis; and
   a second rotating device, connected to an outer portion of said rotating connector, for rotating the wafer about a second axis while said rotating connector rotates about said first axis, said first and second axes being substantially parallel to each other and spaced apart by a designated distance, which said designated distance is variable.

2. A spin-coating apparatus as recited in claim 1, wherein said first rotating device comprises a first spinner with a rotating axis coincident with said first axis, said first spinner rotating at a predetermined velocity.

3. A spin-coating apparatus as recited in claim 1, wherein the rotating connector comprises a rotating disk.

4. A spin-coating apparatus as recited in claim 1, wherein the rotating connector comprises a rotating beam.

5. A spin-coating apparatus as recited in claim 1, wherein the rotating connector comprises rotating crossed beams.

6. A spin-coating apparatus as recited in claim 1, wherein the rotating connector comprises a rotating ring-shaped member.

7. A spin-coating apparatus as recited in claim 1, wherein said second rotating device comprises:
   a second spinner attached to said rotating connector, and with a rotating axis coincident with said second axis and substantially coincident with a central axis of a wafer, said second spinner rotating at a second predetermined velocity; and a vacuum chuck rotatably connected to said second spinner for holding said wafer by a vacuum suction force.

8. A spin-coating apparatus as recited in claim 7, wherein said vacuum chuck is of a size sufficient to adhere an 8 inch wafer.

9. A spin-coating apparatus as recited in claim 7, wherein said vacuum chuck is of a size sufficient to adhere a 12 inch wafer.

10. A spin-coating apparatus as recited in claim 1, wherein said first rotating device and said second rotating device rotate in the same direction.

11. A spin-coating apparatus as recited in claim 1, wherein said first rotating device and said second rotating device rotate in opposite directions.

12. A spin-coating apparatus as recited in claim 1, further comprising a plurality of second rotating devices, connected to the outer portions of said rotating connector.

13. A spin-coating apparatus as recited in claim 1, further comprising an adjusting member for varying said designated distance.

14. A spin-coating apparatus as recited in claim 13, wherein said adjusting member comprises a screw, wherein one end of said screw is connected to said rotating connector and said screw mechanically communicates with said second rotating device via operation of threads of said screw.

15. A spin-coating apparatus for uniformly applying a layer of photoresist material to a wafer, comprising:

a first rotating spinner for rotating a disk about a first axis at a predetermined velocity;

a second rotating spinner, connected to an outer portion of said disk, for rotating the wafer about a second axis substantially coincident with a center axis of said wafer, said spinner rotating at a second predetermined velocity while said disk rotates about said first axis, said first and second axes being substantially parallel and spaced apart by a designated distance;

a vacuum chuck rotatably connected to said second spinner for holding said wafer by a vacuum suction force; and an adjusting member for varying said designated distance, said adjusting member comprising a screw wherein one end of said screw is connected to said rotating disk and said screw mechanically communicates with said second spinner via operation of threads of said screw.

16. A spin-coating method for uniformly applying a layer of photoresist material to a wafer, comprising:

rotating a rotating connector about a first axis with a first rotating device at a first predetermined velocity; and rotating the wafer about a second axis with a second rotating device located at an outer portion of said rotating connector, said second rotating device rotating at a second predetermined velocity while rotating said connector about said first axis, said second axis being substantially coincident with a center axis of said wafer, and said first and second axes being substantially parallel and spaced apart by a designated distance, which said designated distance is variable.

17. A spin-coating method as recited in claim 16, wherein said rotating connector and said wafer rotate in the same direction relative to each other.

18. A spin-coating method as recited in claim 16, wherein said rotating connector and said wafer rotate in opposite directions relative to each other.

19. A spin-coating method as recited in claim 16, further comprising a step of adjusting said designated distance prior to said rotating steps.

20. A spin-coating apparatus for uniformly applying a layer of photoresist material to a wafer, comprising:

a first rotating device for rotating a rotating connector about a first axis; and a second rotating device, connected to an outer portion of said rotating connector, for rotating the wafer about a second axis while said rotating connector rotates about said first axis, wherein said first and second axes are substantially parallel to each other and spaced apart by a designated distance, and wherein said second axis is substantially coincident with a center axis of said wafer, whereby the wafer is substantially parallel to the rotating connector.

* * * * *